(12) United States Patent
Diekmann et al.

(10) Patent No.: US 11,363,730 B2
(45) Date of Patent: Jun. 14, 2022

(54) HOUSING

(71) Applicant: MAHLE International GmbH, Stuttgart (DE)

(72) Inventors: Johannes Diekmann, Schorndorf (DE); Robin Drefs, Bissingen (DE); Sven B. Friedrich, Remshalden (DE); Eugen Makarow, Ludwigsburg (DE); Andrej Rul, Stuttgart (DE); Jeffrey Van Delden, Stuttgart (DE); Benjamin Weimann, Stuttgart (DE)

(73) Assignee: MAHLE International GmbH, Stuttgart (DE)

( * ) Notice: Subject to any disclaimer, the term of this patent is extended or adjusted under 35 U.S.C. 154(b) by 0 days.

(21) Appl. No.: 17/033,626

(22) Filed: Sep. 25, 2020

(65) Prior Publication Data

US 2021/0100121 A1  Apr. 1, 2021

(30) Foreign Application Priority Data

Sep. 26, 2019 (DE) ..................... 10 2019 214 751.8

(51) Int. Cl.
*H05K 5/06* (2006.01)
*H05K 5/02* (2006.01)
*F04D 29/40* (2006.01)

(52) U.S. Cl.
CPC .......... *H05K 5/061* (2013.01); *F04D 29/406* (2013.01); *H05K 5/0221* (2013.01); *H05K 5/0239* (2013.01)

(58) Field of Classification Search
CPC ..... H05K 5/061; H05K 5/0239; H05K 5/0221
See application file for complete search history.

(56) References Cited

U.S. PATENT DOCUMENTS

| | | |
|---|---|---|
| 5,516,186 A | 5/1996 | Scherf et al. |
| 5,761,046 A | 6/1998 | Hein et al. |
| 9,462,715 B2 | 10/2016 | Nuriya et al. |

(Continued)

FOREIGN PATENT DOCUMENTS

| | | |
|---|---|---|
| CN | 2847538 Y | 12/2006 |
| CN | 104612958 A | 5/2015 |

(Continued)

OTHER PUBLICATIONS

Office Action dated Sep. 3, 2021 issued in Chinese counterpart application No. 202011017043.2 and English-language Office Action Summary thereof.

*Primary Examiner* — Hung V Ngo
(74) *Attorney, Agent, or Firm* — Falk Ewers; Ewers IP Law PLLC

(57) ABSTRACT

A housing for accommodating electrical components, in particular in a liquid pump, includes a housing pot including a bottom and a surrounding wall protruding from the bottom, as well as a housing cover closing the housing pot, including a shoulder protruding in the direction of the bottom. A simplified and cost-efficient production of the housing as well as an increased operational safety of the liquid pump are attained in that the housing cover forms a caulking connection with the surrounding wall of the housing pot with the help of at least one recess formed in the shoulder. The disclosure furthermore relates to a liquid pump including a housing of this type as well as a method for producing a liquid pump of this type.

12 Claims, 4 Drawing Sheets

(56) References Cited

U.S. PATENT DOCUMENTS

| | | | |
|---|---|---|---|
| 9,677,548 B2 | 6/2017 | Pademi et al. | |
| 9,967,993 B1* | 5/2018 | Walker | H05K 7/1418 |
| 10,294,937 B2 | 5/2019 | Hodgson et al. | |
| 2007/0158094 A1* | 7/2007 | Burca | H05K 5/061 |
| | | | 174/66 |
| 2013/0099644 A1* | 4/2013 | Takeuchi | E05C 1/085 |
| | | | 312/326 |
| 2015/0014436 A1 | 1/2015 | Koch et al. | |
| 2015/0156903 A1* | 6/2015 | Heimerl | H05K 5/0208 |
| | | | 174/520 |
| 2017/0238433 A1* | 8/2017 | Jiang | H05K 5/0221 |
| | | | 174/535 |
| 2019/0305406 A1* | 10/2019 | Williams | H01Q 1/1207 |
| 2019/0343012 A1* | 11/2019 | Ho | H05K 5/0221 |
| 2020/0248811 A1 | 8/2020 | Fukuyama et al. | |
| 2020/0404798 A1* | 12/2020 | Ho | H05K 5/0047 |
| 2021/0218238 A1* | 7/2021 | Allen | H02G 15/013 |

FOREIGN PATENT DOCUMENTS

| | | |
|---|---|---|
| CN | 104955301 A | 9/2015 |
| CN | 106068367 A | 11/2016 |
| CN | 207647759 U | 7/2018 |
| CN | 109790852 A | 5/2019 |
| CN | 109973380 A | 7/2019 |
| DE | 102008053468 B3 | 4/2010 |
| DE | 112018003915 T5 | 4/2020 |
| JP | 2003151254 A | 5/2003 |

* cited by examiner

HOUSING

CROSS REFERENCE TO RELATED APPLICATIONS

This application claims priority to German patent application DE 10 2019 214 751.8, filed Sep. 26, 2019, the entire content of which is incorporated herein by reference.

TECHNICAL FIELD

The present disclosure relates to a housing for accommodating electrical components, in particular in a liquid pump. The disclosure furthermore relates to a liquid pump comprising a housing of this type as well as a method for producing a liquid pump of this type.

BACKGROUND

In a variety of applications, it is necessary to accommodate electrical components in a housing. On the one hand, this serves to protect the electrical components and, on the other hand, is to prevent or at least reduce an unwanted penetration of a fluid into the housing and thus to the components. Housings of this type usually comprise a housing pot and a housing cover, which closes the housing pot. When attached to the housing pot, the housing pot and the housing cover define an internal volume, which serves to accommodate the electrical components.

Liquid pumps, in particular water pumps, belong to the scopes of application of housings of this type. It is necessary thereby to prevent or at least to reduce a penetration of the pumped liquid or of the liquid to be pumped into the housing and damages to the electrical components associated therewith.

Screw connections can generally be used to fix the housing cover to the housing pot. As a result, the housing and the associated application have more individual parts, in particular screws, nuts, and the like. This results in a complex fixation of the housing cover to the housing pot, so that the production of the associated application also becomes complex and expensive.

It is also conceivable to fix the housing cover to the housing pot with a locking connection, in particular with a clip connection. Clip elements made of plastic are usually used for this purpose. This, in turn, leads to an increased number of the required components. Moreover, there is the risk that different expansion coefficients in the area of the locking connections lead to a so-called drifting and thus to an at least temporary detaching of the housing cover from the housing pot. This would allow or promote an at least temporary penetration of a fluid into the housing.

Said fixation types further require small tolerances between the housing cover and the housing pot and/or the corresponding additionally used elements. This, in turn leads to an increased effort in the production of the housing cover and of the housing pot, as well as of said elements, and increases the production costs.

SUMMARY

It is thus an object of the present disclosure to provide an improved or at least other embodiments for a housing for accommodating electrical components as well as for a liquid pump comprising a housing of this type, and for a method for producing a liquid pump of this type, which are characterized by a simple and/or cost-efficient production and/or increased operational safety.

This object is achieved by a housing for accommodating electrical components, a liquid pump, and a method for producing a liquid pump as described herein.

The present disclosure is based on the general idea of fixing a housing pot and a housing cover, which closes the housing pot, of a housing for accommodating electrical components to one another with a caulking connection. In the case of the caulking connection, the deformation of at least one of the components takes place in the direction of the other component, so that additional component parts for fixing the housing cover to the housing pot are dispensed with or are at least reduced. This leads to a simplified and cost-efficient production of the housing and of the associated application. Due to the fact that the caulking connection is implemented by a deformation of the housing per se, thermal shifts between the housing cover and the housing pot are prevented or at least reduced in the area of the caulking connection. This leads to a stable fixation of the housing cover to the housing pot. A penetration of a fluid, in particular of a liquid, which results therefrom and which is unwanted, into the housing is moreover prevented or at least reduced thereby, so that the electrical components accommodated in the housing are better protected and/or the operational safety of the associated application is improved.

According to an aspect of the disclosure, the housing has the housing pot and the housing cover. Housing pot and housing cover are produced separately and are subsequently fixed to one another with said caulking connection, wherein at least one electrical component of the associated application is advantageously arranged in the housing prior to the fixation of the housing cover to the housing pot. The housing pot has a bottom as well as a circumferential surrounding wall, which protrudes from the bottom. The bottom and the surrounding wall surround an internal volume of the housing, which serves to accommodate the at least one electrical component. The surrounding wall has a connecting portion, which serves to establish the caulking connection. On the side facing away from the internal volume, the connecting portion has a support surface, which runs in the direction of the bottom, and a support step, which follows the outer surface in the direction of the bottom, in particular adjacent to the support surface. The support step runs in the direction of the internal volume. The housing cover has a shoulder, which protrudes in the direction of the bottom and which can run circumferentially. The shoulder is arranged on the side of the connecting portion facing away from the internal volume. When attached to the housing pot, the shoulder projects beyond the support surface in the direction of the bottom and has a recess associated with the support step in the manner of a window. The recess is in particular defined completely by the shoulder. On the side facing the bottom, the recess is defined by a lower portion, and, on the side facing away from the bottom, by an upper portion of the shoulder. The upper portion is arranged on the side of the support surface facing away from the internal volume, in particular abuts on the side of the support surface facing away from the internal volume. The lower portion is plastically deformed or caulked, respectively, in the direction of the internal volume, and is arranged on the side of the support step facing the bottom in such a way that the shoulder forms the caulking connection with the connecting portion. The deformed lower portion in particular abuts on the support step.

The connecting portion of the surrounding wall can generally be arranged and formed at any point of the surrounding wall. The connecting portion is preferably spaced apart from the bottom.

The connecting portion is advantageously arranged on the side of the surrounding wall facing away from the bottom and thus on the front side of the surrounding wall. This leads to an installation space-saving formation of the housing as well as to a simplified implementation of the caulking connecting.

In the case of advantageous embodiments, the lower portion has a nose projecting into the recess. The nose is deformed in the direction of the internal volume and is arranged on the side of the support step facing the bottom, in particular abuts on the support step. Due to the fact that the nose extends at least partially in the direction of the support step and is deformed to establish the caulking connection, it is possible to establish the caulking connection to the support step in a reliable and stable manner with different original spaces between the lower portion and the nose. This results in that the connecting portion and thus the housing pot as well as the recess and thus the housing cover can be produced with higher tolerances. The housing pot as well as the housing cover can thus be produced more easily and more cost-efficiently. A simplified and more cost-efficient production of the housing as well as of the associated application thus takes place with a simultaneously stable caulking connection.

It is preferred when the nose is spaced apart from the upper portion of the recess, thus does not separate the recess. This allows for a simplified deformation of the nose and moreover leads to an improved tolerance compensation.

The recess can generally be formed at any point of the shoulder.

It is preferred when the shoulder has an outer edge on the end side in the direction of the bottom, wherein the outer edge has the lower portion of the recess. In other words, the shoulder is deformed on the edge side in the area of the recess in order to establish the caulking connection by deforming the lower portion. The establishing of the caulking connection is thus possible more easily. The housing cover can moreover be produced with less material expenditure in this way, so that the production of the housing is more cost-efficient, in turn. The housing furthermore has a reduced weight in this way.

Embodiments are preferred, in the case of which a seal for sealing the internal volume to the outside is arranged between the housing cover and the housing pot. The seal is preferably acted upon in a sealing manner between the housing cover and the housing pot.

In the case of advantageous embodiments, the connecting portion has a sealing groove, which is open on the front side and thus on the side facing away from the bottom, and in which the seal is accommodated. The seal is acted upon between the housing cover and the connecting portion, in order to seal the internal volume of the housing.

It is advantageous thereby when the housing cover acts on the seal with a base portion, from which the shoulder protrudes in the direction of the bottom, and thus acts upon the seal.

In the case of an advantageous further development of the solution according to the disclosure, the support step is part of a groove of the housing pot, which is open on the side facing away from the internal volume, wherein this groove will also be referred to below as connecting groove. For this purpose, the surrounding wall has a groove step, which is located opposite the support step in the direction of the bottom and which forms the connecting groove with the support step. This means that the lower portion of the recess is deformed into the connecting groove to establish the caulking connection. The connecting groove simplifies the fixation of the housing cover to the housing pot and leads to a mechanical stabilization of the caulking connection. A protection of the deformed lower portion and thus a protection of the caulking connection in particular takes place with the connecting groove.

Embodiments, in the case of which the support surface has a protrusion protruding in the direction of the shoulder prove to be advantageous. The protrusion preferably protrudes in the direction of the upper portion and has an outer surface, which faces the shoulder and which advantageously runs in a planar and flat manner. This simplifies the attaching of the housing cover to the housing pot and thus the production of the housing as well as of the associated application.

The housing can generally have any shape and any dimensions.

It is preferred when the housing pot is formed in a cuboid-like manner. In particular, the surrounding wall in each case has two wall portions, which are located opposite one another and which run in parallel. It is preferred thereby when the connecting portion is arranged, in particular formed, at least at one of the wall portions located opposite one another. It is conceivable that the connecting portion runs circumferentially.

Analogously, the shoulder preferably has a shape, which corresponds to the connecting portion. In particular, the shoulder in each case has two shoulder portions, which are located opposite one another and which run in parallel. This simplifies in particular the alignment of the housing cover relative to the housing pot.

It is preferred when the recess is arranged in one of the shoulder portions located opposite one another. The establishing of the caulking connection is thus simplified and the caulking connection is stabilized mechanically.

The housing pot and the housing cover can generally be made of any materials. The housing pot and the housing cover can be made, for example, of a metal or of a metal alloy. It is conceivable to make the housing cover and/or the housing pot of a band, in particular of a sheet metal.

Embodiments are also conceivable, in the case of which the housing pot is at least partially made of plastic. It is likewise conceivable to at least partially make the housing cover of plastic.

In the case of preferred embodiments, the shoulder of the housing cover is made of a metal or of a metal alloy. The shoulder is made in particular of a band, in particular of sheet metal. This allows in particular for a simplified shaping of the lower portion as well as for a stable establishing of the caulking connection. In contrast, the base portion of the housing cover, from which the shoulder protrudes, can be made of a different material, in particular of plastic. It is particularly advantageous thereby when the shoulder is injection molded by the plastic for producing the base portion. The production of the shoulder from metal or a metal alloy as well as of the base portion from plastic results in that the housing cover and thus the housing has a lower weight. The housing is moreover better protected against corrosion in this way. The housing cover is furthermore more cost-efficient in this way.

Only one caulking connection can generally be provided to fix the housing cover to the housing pot.

In the case of preferred embodiments, at least two, preferably more, caulking connections of this type are provided to fix the housing cover to the housing pot. The respective caulking connection thereby advantageously has an associated recess comprising an associated, deformed lower portion. This means that in this case, the shoulder has at least two, advantageously more, recesses of said type, which are circumferentially spaced apart from one another. This results in that the caulking connections are circumferentially spaced apart from one another.

The recesses and thus the caulking connections are in particular distributed evenly circumferentially, so that an even and homogenous fixation of the housing cover to the housing pot takes place. This further results in that the seal arranged between the housing cover and the housing pot is acted upon evenly, so that the internal volume is sealed to the outside in an improved manner.

It is conceivable to provide an associated support step and an associated support surface and thus an associated connecting portion for the respective caulking connection and thus for the respective lower portion. In this case, the housing pot thus has support steps and support surfaces, which are circumferentially spaced apart from one another.

It is preferred when a common support step and a common support surface and thus a common connecting portion is provided for at least two of the lower portions, preferably for all lower portions. The production of the housing pot is thus simplified, so that the housing pot can be produced more cost-efficiently.

The housing can generally serve to accommodate any electrical components and can be used in any application.

The housing is used for example in a liquid pump, in particular a water pump, wherein the housing accommodates electrical components required for the operation of the liquid pump.

It goes without saying that in addition to the housing, a liquid pump of this type also belongs to the scope of this disclosure.

It further goes without saying that a method for producing a liquid pump of this type also belongs to the scope of this disclosure.

In the case of the method, at least one an electrical component of the liquid pump is accommodated in the housing, and the housing cover is subsequently fixed to the housing pot by establishing at least one caulking connection of said type.

In the case of advantageous embodiments, a plunger for caulking the lower portion of the recess is provided to establish the caulking connection. The plunger has an L-shaped outer contour comprising a support leg and a caulking leg protruding from the support leg. To establish the caulking connection, the support leg is arranged on the side of the upper portion facing away from the support surface, so that the caulking leg is arranged on the side of the lower portion facing away from the internal volume, spaced apart from the upper portion, in particular bears on the lower portion. The plunger is subsequently moved in the direction of the internal volume, and thus deforms the lower portion in the direction of the internal volume in such a way that the lower portion is arranged on the side of the support step facing the bottom, in particular bears on the support step.

Further important features and advantages of the disclosure follow from the subclaims, from the drawings, and from the corresponding figure description on the basis of the drawings.

It goes without saying that the above-mentioned features and the features, which will be described below, cannot only be used in the respective specified combination, but also in other combinations or alone, without leaving the scope of the present disclosure.

BRIEF DESCRIPTION OF THE DRAWINGS

The disclosure will now be described with reference to the drawings wherein.

DESCRIPTION OF EXEMPLARY EMBODIMENTS

Figure 1:
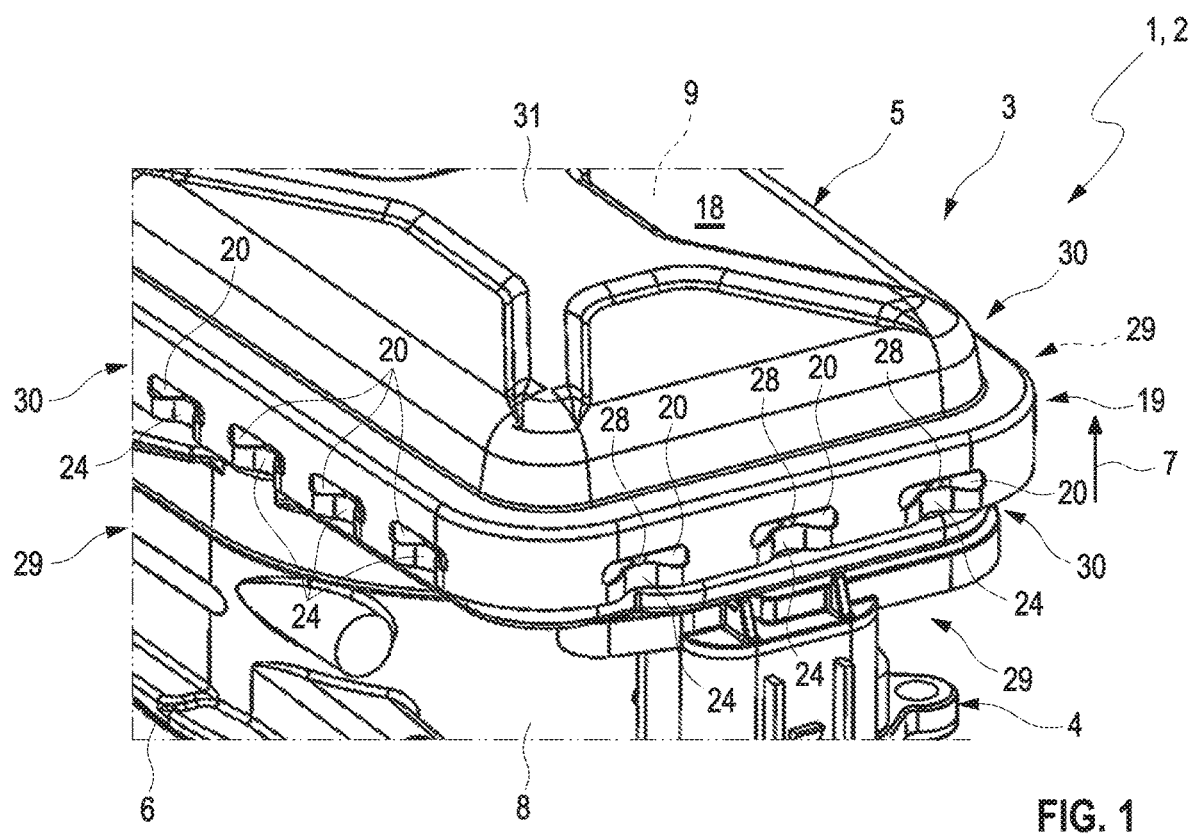
FIG. 1 shows an isometric view of a liquid pump comprising a housing.

Exemplary embodiments of the disclosure are illustrated in the drawings and will be described in more detail in the following description, whereby identical reference numerals refer to identical or similar or functionally identical components.

A liquid pump 1, in particular a water pump 2, as it is shown, for example, in FIGS. 1, 2, 5, 6, and 7, has a housing 3, as it is shown in FIGS. 1 to 8. The housing 3 has a housing pot 4 as well as a housing cover 5, as it is illustrated separately, for example in FIGS. 3, 4, and 8. The housing pot 4 has a bottom 6, which is suggested in FIG. 1, as well as a circumferential surrounding wall 8, which protrudes from the bottom 6 in a height direction 7. The surrounding wall 8 is preferably closed circumferentially. The bottom 6 and the surrounding wall 8 surround an internal volume 9 of the housing 3, in particular define the internal volume 9. The internal volume 9 serves to accommodate at least one non-shown electrical component of the liquid pump 1. The housing cover 5 closes the housing pot 4 and surrounds the internal volume 9. The housing cover 5 in particular defines the internal volume 9.

Figure 2:
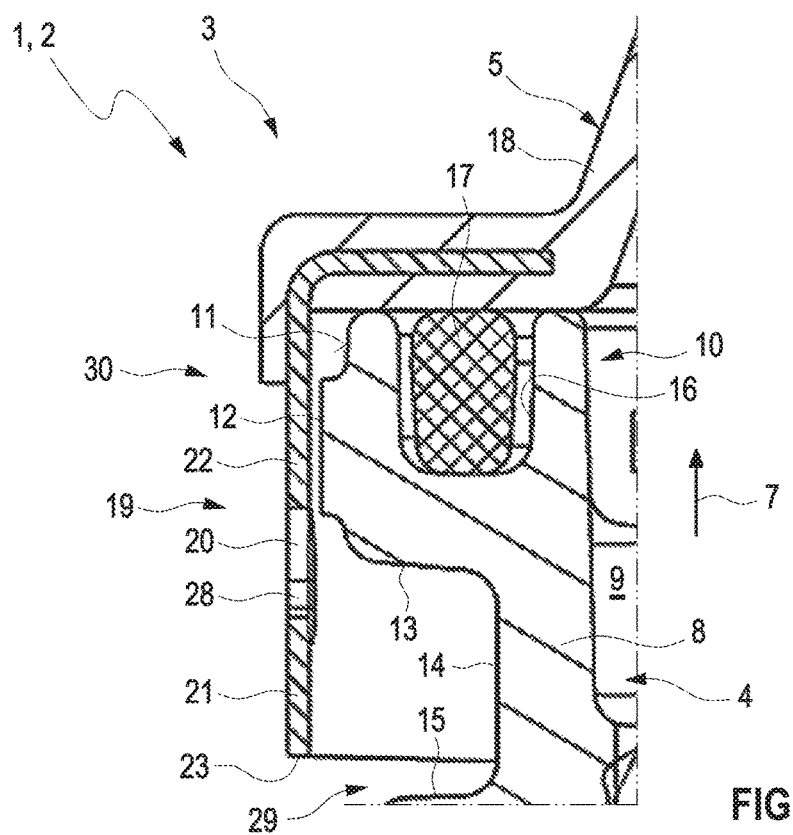
FIG. 2 shows a section through the housing during the production of the liquid pump.
Figure 5:
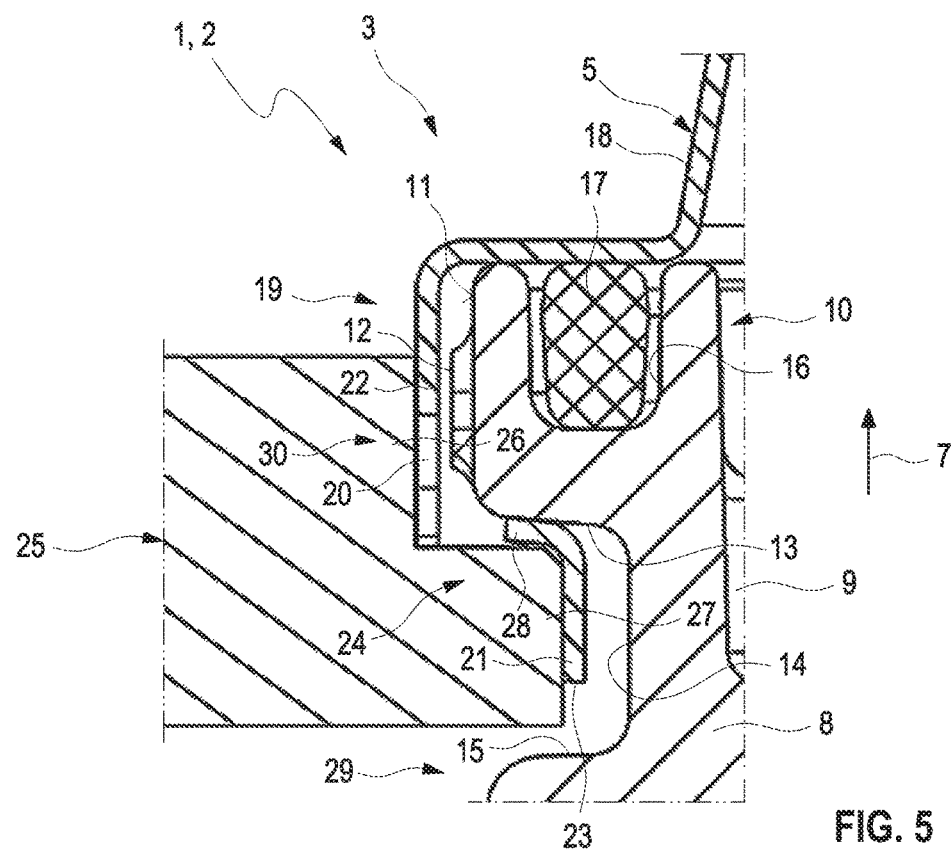
FIG. 5 shows the view from FIG. 2 after production of the liquid pump is concluded and in the case of another exemplary embodiment of the housing cover.

FIGS. 2 and 5 in each case show a section through the housing 3 in the area of the surrounding wall 8 and of the housing cover 5. As can in particular be gathered from these figures, the surrounding wall 8 has a connecting portion 10, which, in the shown examples, is arranged on the front side on the side of the surrounding wall 8 facing away from the bottom 6. On the side facing away from the internal volume 9, the connecting portion 10 has a support surface 11, which runs in the direction of the bottom 6 or along the height direction 7, respectively. In the shown examples, the support surface 11 moreover has a protrusion 12, which protrudes on the side facing away from the internal volume 9. A support step 13 of the connecting portion 10, which runs in the direction of the internal volume 9, in the shown examples transversely to the height direction 7, follows the support surface 11, in particular adjacently, in the direction of the bottom 6. In the shown examples, the support step 13 is part of a connecting groove 14, which moreover has a groove step 15 located opposite the support step 13 in the direction of the bottom 6. On the side facing away from the bottom 6, the connecting portion 10 of the shown examples further has a sealing groove 16, which faces away from the bottom 6, in particular in the height direction 7, and which is open on the front side and in which a seal 17 is accommodated.

The housing cover 5 has a base portion 18, which is located opposite the bottom 6 in the height direction 7 and which surrounds, in particular defines, the internal volume 9. A shoulder 19 of the housing cover 5, which runs in a circumferentially closed manner in the shown examples, protrudes from the base portion 18 in the direction of the bottom 6, in particular along the height direction 7. The shoulder 19 is arranged on the side of the connecting portion 10 facing away from the internal volume 9. The shoulder 19 thereby projects beyond the support surface 11 in the direction of the bottom 6. The shoulder 19 has at least one recess 20, wherein the shoulder 19 has several recesses 20 in the shown examples, which are circumferentially spaced apart from one another. In the shown examples, the recesses 20 of the respective shoulder 19 are further formed identically. As can in particular be gathered from FIG. 4, the respective recess 20 is defined by a lower portion 21 facing the bottom 6 and by an upper portion 22 of the shoulder 19 facing away from the bottom 6. In the shown examples, the respective lower portion 21 is part of an outer edge 23 of the shoulder 19 on the outside in the direction of the bottom 6. As can in particular be gathered from FIGS. 2 and 5, which in each case show a section in the area of a recess 20 of this type, the respective upper portion 22 is arranged in the area of the support surface 11, in particular of the protrusion 12, and the respective lower portion 21 is arranged in the area of the support step 13 or of the connecting groove 14, respectively.

As can be gathered from FIGS. 1, 5, as well as 6 and 7, an associated caulking connection 24 is thereby established with the respective recess 20 or the lower portion 21, respectively, of the respective recess 20. FIGS. 1, 5, 6, and 7 thereby show the state after the respective caulking connection 24 is established, and the remaining figures show the state before the respective caulking connection 24 is established. As is shown by a comparison between the states before the respective caulking connection 24 is established and after the respective caulking connection 24 is established, in particular by a comparison between FIGS. 2 and 5, a plastic deformation of the respective associated lower portion 21 in the direction of the internal volume 9, in the shown examples thus into the connection groove 14, takes place in such a way in order to establish the respective caulking connection 24. This deformation takes place in such a way that the lower portion 21 is arranged on the side of the support step 13 facing the bottom 6, wherein the lower portion 21 bears on the support step 13 in the shown examples. In this state, that is, after the respective caulking connection 24 is established, the housing cover 5 acts upon the seal 17 in the direction of the bottom 6, so that the seal 17 seals the internal volume 9 to the outside.

A plunger 25 shown in FIG. 5 can be used to deform or caulk, respectively, the respective lower portion 21. The plunger 25 has an L-shaped outer contour comprising a support leg 26 and a caulking leg 27 protruding from the support leg 26. To establish the respective caulking connection 24, the plunger 25 is positioned in such a way that the support leg 26 is arranged on the side of the upper portion 22 facing away from the connecting portion 10 or from the internal volume 9, respectively, while the caulking leg 26 is arranged on the side of the lower portion 21 facing away from the connecting portion 10 or from the internal volume 9, respectively. The plunger 25 is subsequently moved in the direction of the internal volume in order to caulk or to deform, respectively, the lower portion 21 in such a way that the lower portion 21, as can be gathered from FIG. 5, is arranged on the side of the support step 13 facing the bottom 6, in particular bears on the support step 13, in order to establish the caulking connection 24. FIG. 5 thereby shows an end position of the plunger 25 after the production of the caulking connection 24 has been concluded.

Figure 3:
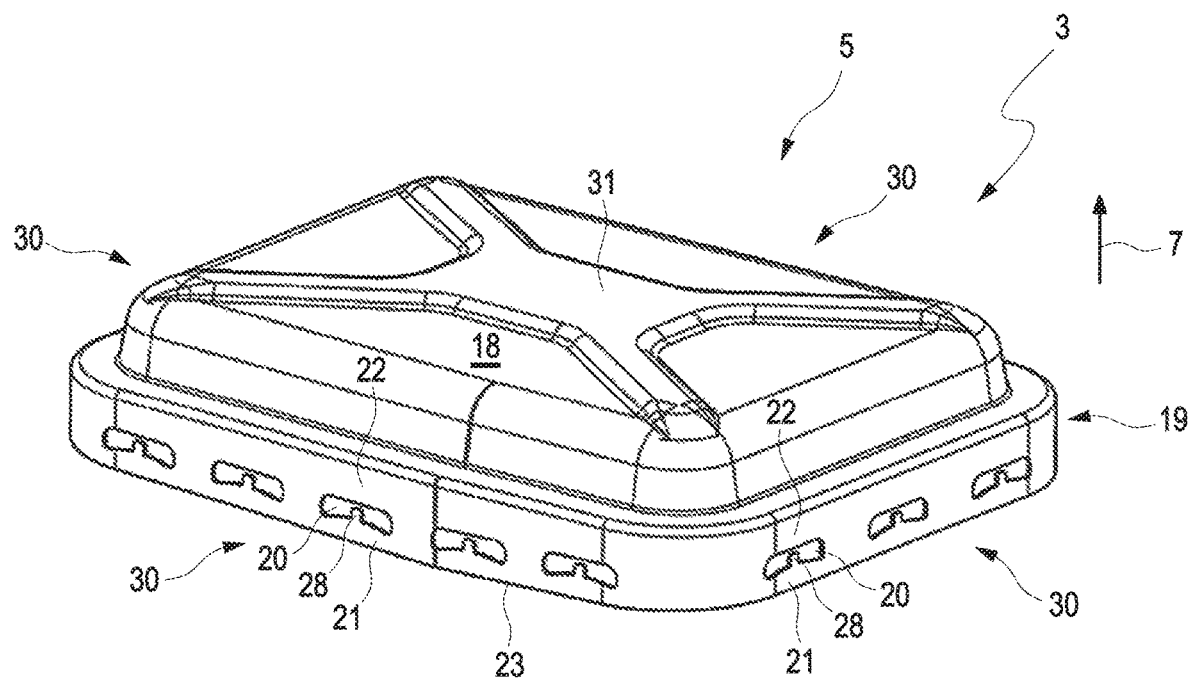
FIG. 3 shows an isometric view of a housing cover of the housing prior to the production of the liquid pump.
Figure 4:
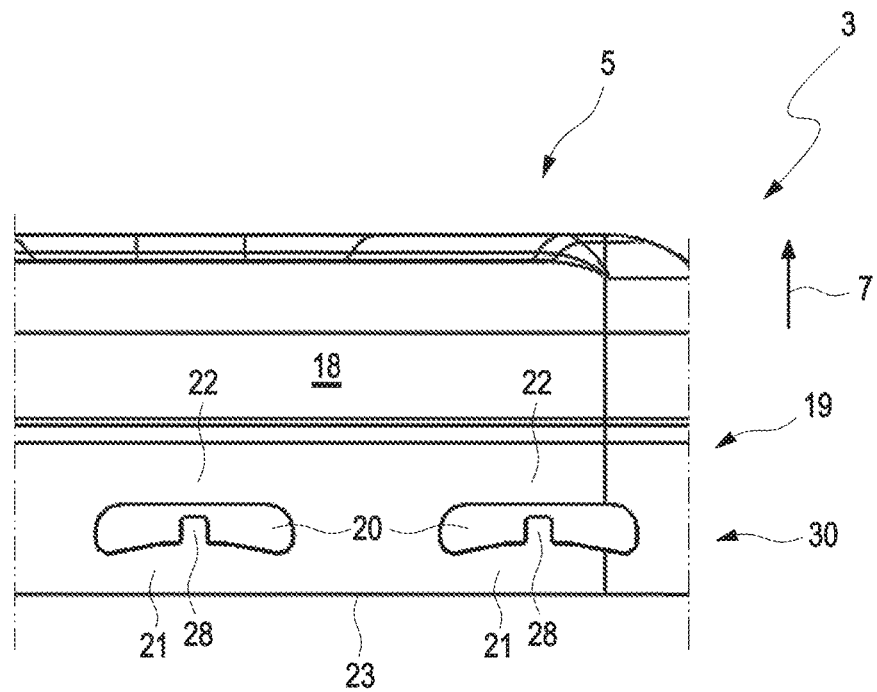
FIG. 4 shows a side view of the housing cover from FIG. 3.

In the case of the exemplary embodiments shown in FIGS. 1 to 5 as well as 7 and 8, the respective lower portion 21 has a nose 28, which protrudes and which penetrates into the associated recess 20, as can in particular be gathered from FIGS. 3 and 4. In the case of the deformation of the lower portion 21, the nose 28 is thereby moved in the direction of the internal volume 9 and is deformed with the support step 13 in such a way that the nose 28, as can be gathered for example from FIG. 5, bears on the support step 13 in order to establish the respective caulking connection 24. The respective caulking connection 24 is thus reinforced and stabilized. A tolerance compensation can moreover take place with the help of the nose 28.

FIGS. 2 and 5 show different exemplary embodiments, which differ by the formation of the housing cover 5. In the case of the exemplary embodiment of FIG. 5, the housing cover 5 is made of a sheet metal with shaping. In the case of the exemplary embodiment of FIG. 2, the shoulder 19 is made of a sheet metal and is injection molded by the base portion 18, which is advantageously made of plastic.

Figure 6:
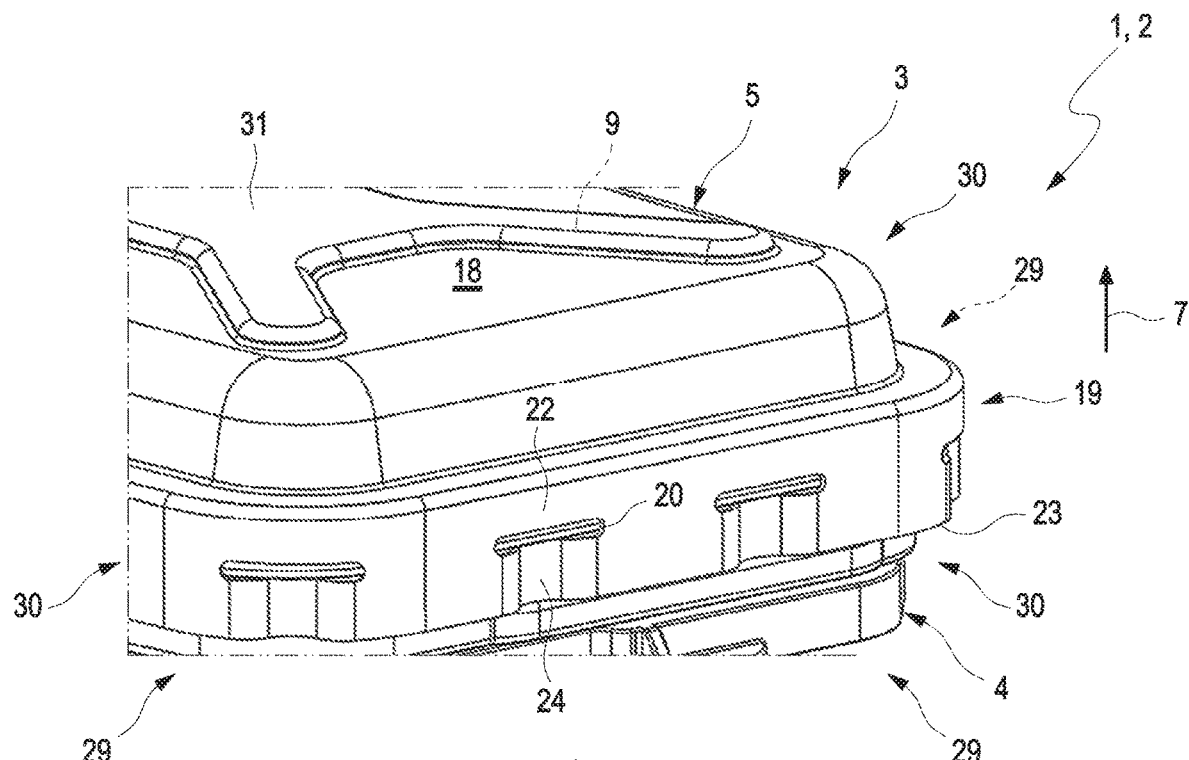
FIG. 6 shows an isometric view of the liquid pump in the case of another exemplary embodiment.

The exemplary embodiment shown in FIG. 6 corresponds to the exemplary embodiments shown in FIGS. 1 to 5 with the difference that the respective lower portion 21 does not have a nose 28.

In the shown exemplary embodiments, the recesses 20 and thus the caulking connections 24 are arranged so as to be circumferentially spaced apart from one another and so as to be evenly distributed. The connecting portion 10 thereby likewise runs circumferentially, so that the same connecting portion 10 comprising the same support step 13 and the same support surface 11 is provided for all lower portions 21.

In the shown exemplary embodiments, the housing pot 4 has a cuboid-like shape, wherein the surrounding wall 8 comprising the connecting portion 10 in each case has two parallel wall portions 29, which are located opposite one another. Two of the wall portions 29 located opposite one another are thereby larger or longer, respectively, than the other wall portions 29 located opposite one another. The shoulder 19 has a shape, which corresponds to the surrounding wall 8 or to the connecting portion 10, respectively, and thus in each case two shoulder portions 30, which are located opposite one another and run in parallel, wherein two of the shoulder portions 30 located opposite one another are longer or larger, respectively, than the other two shoulder portions 30. More recesses 20 are thereby provided in the larger shoulder portions 30 than in the shorter shoulder portions 30. More caulking connections 24 are thus provided in the longer shoulder portions 30 than along the shorter shoulder portions 30.

In the case of the exemplary embodiments shown in FIGS. 1 to 6, the base portion 18 has a molding 31, which protrudes outwards in the height direction 7 and with which a reinforcement and stabilization of the housing cover 5 takes place.

Figure 7:
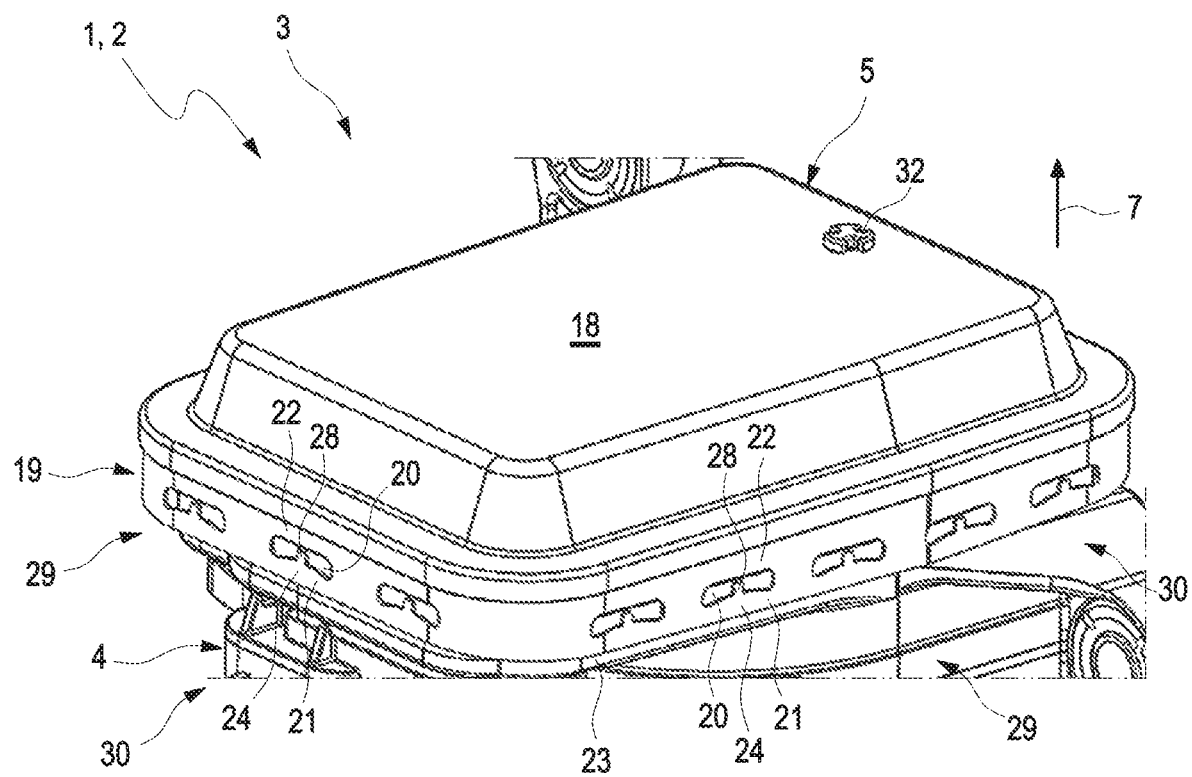
FIG. 7 shows an isometric view of the liquid pump in the case of a further exemplary embodiment.
Figure 8:
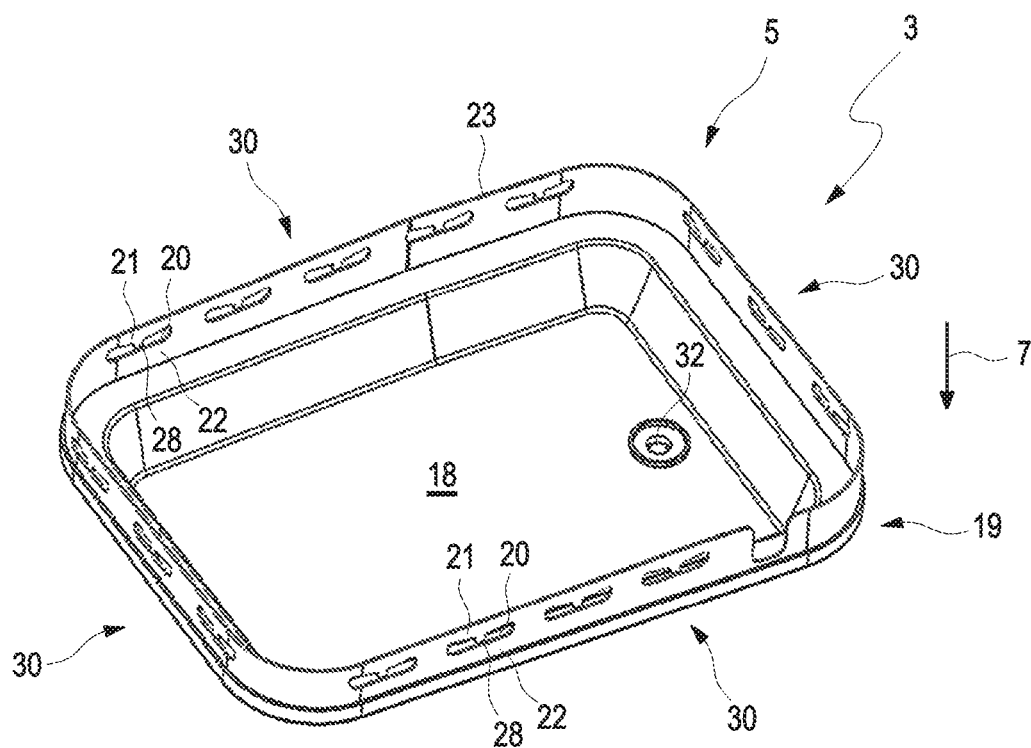
FIG. 8 shows an isometric view of the housing cover of the liquid pump from FIG. 7.

The exemplary embodiment shown in FIGS. 7 and 8 differs from the exemplary embodiments shown in FIGS. 1 to 5 in that the base portion 18 is produced without protrusion 31, wherein a membrane 32 is provided in the base portion 18, which, if necessary, establishes a fluidic connection between the internal volume 9 and the surrounding area of the housing 3. In the case of a pressure difference between the internal volume 9 and the surrounding area of the housing 3, the membrane 32 allows for a gas exchange for the purpose of a pressure compensation. The membrane 32 simultaneously prevents the penetration of liquids into the internal volume 9.

It is understood that the foregoing description is that of the exemplary embodiments of the disclosure and that various changes and modifications may be made thereto without departing from the spirit and scope of the disclosure as defined in the appended claims.

What is claimed is:

1. A housing for accommodating electrical components in a liquid pump, the housing comprising:
    a housing pot and a housing cover, which closes the housing pot, wherein:
    the housing pot has a bottom and a circumferential surrounding wall, which protrudes from the bottom, which surround an internal volume of the housing pot,
    the surrounding wall has a connecting portion,
    on the side facing away from the internal volume, the connecting portion has a support surface, which runs in the direction of the bottom, and a support step, which follows the support surface in the direction of the bottom and runs in the direction of the internal volume,
    the housing cover has a shoulder, which protrudes in the direction of the bottom and which is arranged on the side of the connecting portion facing away from the internal volume,
    the shoulder projects beyond the support surface in the direction of the bottom,
    the shoulder has a recess associated with the support step,
    on its side facing the bottom, the recess is defined by a lower portion, and, on its side facing away from the bottom, by an upper portion of the shoulder,
    the upper portion is arranged on the side of the support surface facing away from the internal volume,
    the lower portion is deformed in the direction of the internal volume, and is arranged on the side of the support step facing the bottom in such a way that the shoulder forms a caulking connection with the connecting portion.

2. The housing according to claim 1, wherein the connecting portion is arranged on the front side of the surrounding wall.

3. The housing according to claim 2, wherein:
    the connecting portion has a sealing groove, which is open on the side facing away from the bottom,
    a seal is accommodated in the sealing groove,
    the housing cover acts upon the seal in a sealing manner in the sealing groove.

4. The housing according to claim 1, wherein the lower portion has a nose, which projects into the recess and which is deformed with the lower portion and which is arranged on the side of the support step facing the bottom.

5. The housing according to claim 1, wherein, on the outer side in the direction of the bottom, the shoulder has an outer edge, which has the lower portion.

6. The housing according to claim 1, wherein the surrounding wall has a groove step, which is located opposite the support step in the direction of the bottom and which, with the support step, forms an open connecting groove, which faces away from the internal volume and in which the lower portion is deformed.

7. The housing according to claim 1, wherein the support surface has a protrusion protruding in the direction of the shoulder.

8. The housing according to claim 1, wherein:
    the housing cover has a base portion, from which the shoulder protrudes,
    the shoulder is made of a metal or of a metal alloy, and the base portion is made of plastic,
    the shoulder is injection molded by the base portion.

9. The housing according to claim 1, wherein at least two caulking connections are provided, which are circumferentially spaced apart from one another, and wherein the respective caulking connection has an associated recess of the shoulder.

10. A liquid pump, in particular water pump, comprising:
    the housing according to claim 1, and
    at least one electrical component, which is accommodated in the housing.

11. A method for producing a liquid pump according to claim 10, the method comprising:
    providing the housing comprising the housing pot and the housing cover;
    arranging at least one electrical component in the internal volume of the housing;
    closing the housing pot with the housing cover; and
    caulking the lower portion in the direction of the internal volume to establish the caulking connection.

12. The method according to claim 11, wherein:
    a plunger is provided, which has an L-shaped outer contour comprising a support leg and a caulking leg protruding from the support leg,
    the support leg is arranged on the side of the upper portion facing away from the support surface in such a way that the caulking leg is arranged on the side of the lower portion facing away from the internal volume, spaced apart from the upper portion, and
    the plunger is moved in the direction of the internal volume in such a way that the lower portion is deformed in the direction of the internal volume and is arranged on the side of the support step facing the bottom.

* * * * *